United States Patent [19]

Nomura

[11] Patent Number: 5,780,927
[45] Date of Patent: Jul. 14, 1998

[54] SEMICONDUCTOR DEVICE WITH LONG LIFETIME

[75] Inventor: Yukio Nomura, Tokyo, Japan

[73] Assignee: NEC Corporation, Tokyo, Japan

[21] Appl. No.: 832,677

[22] Filed: Apr. 9, 1997

[30] Foreign Application Priority Data

Apr. 10, 1996 [JP] Japan ................................. 8-088159

[51] Int. Cl.⁶ ........................... H01L 23/10; H01L 23/34
[52] U.S. Cl. ........................... 257/706; 257/707; 257/717
[58] Field of Search ................................. 257/706, 707, 257/720, 717

[56] References Cited

U.S. PATENT DOCUMENTS 4,615,031  9/1986  Eales et al.
5,299,214  3/1994  Nakamura et al. ................ 257/706
5,324,987  6/1994  Iacovangelo et al. ............. 257/701

FOREIGN PATENT DOCUMENTS 2-146748  6/1990  Japan.

*Primary Examiner*—Mahshid D. Saadat
*Assistant Examiner*—S. V. Clark
*Attorney, Agent, or Firm*—Sughrue, Mion, Zinn, Macpeak & Seas, PLLC

[57] ABSTRACT

A semiconductor device includes a heat radiator having a convex portion. A reinforcement plate having a thermal conductivity is soldered on a portion of the convex portion of the heat radiator by a solder having a Young's modulus lower than a silver copper solder and a melting point lower than the silver copper solder. A semiconductor element soldered on the reinforcement plate by the solder.

15 Claims, 4 Drawing Sheets

SEMICONDUCTOR DEVICE WITH LONG LIFETIME

BACKGROUND OF THE INVENTION

1. Field of the Invention

The present invention relates to a semiconductor device, and more particularly to a semiconductor device which has a metallic heat radiator on which a semiconductor element is installed.

2. Description of Related Art

FIG. 1A is a plan view illustrating of the first conventional example of a semiconductor device in which high radiation capability is required. FIG. 1B is a vertical cross section view of the semiconductor device cut along the line 1B—1B', and Fig. 1C is a horizontal cross section view of the semiconductor device cut along the line 1C—1C'. As shown in FIGS. 1A to 1C, in the conventional semiconductor device, a semiconductor element 4 is mounted on a copper heat radiator 3. In FIGS. 1A to 1C, a reference numeral 1 denotes a lead, and a reference numeral 2 shows a ceramic body to seal the semiconductor element 4. Material such as copper and so on has a high thermal conductivity and often a high thermal expansion coefficient at the same time. As shown in the following table 1, copper has 3 to 5 times as large thermal expansion coefficient as that of the semiconductor element 4.

TABLE 1

| thermal expansion coefficients of metal and semiconductor element | | |
|---|---|---|
| Copper | Si | GaAs |
| thermal expansion coefficient (/°C.)  $18 \times 10^{-6}$ | $3.2 \times 10^{-6}$ | $6.0 \times 10^{-6}$ |

Therefore, when tests such as heat shock and heat cycle are performed after the semiconductor element 4 is mounted on the metal heat radiator 3, there is a problem in that crack occurs in the semiconductor element 4.

In order to solve this problem in the first conventional example, there is proposed the technique which is disclosed in Japanese Laid Open Patent Disclosure (JP-A-Heisei 2-146748) (the second conventional example). FIG. 2A is a plan view illustrating of the second conventional example of a semiconductor device using the technique disclosed in the reference. FIG. 2B is a vertical cross section view of the semiconductor device cut along the line 2B—2B', and FIG. 2C is a horizontal cross section view of the semiconductor device cut along the line 2C—2C'. As shown in FIGS. 2A to 2C, in the semiconductor device of the second conventional example, copper tungsten plates 6 are soldered on both surfaces of a copper heat radiator 5. The semiconductor element 4 is mounted on the upper surface of the copper tungsten plate 6. Thereby, the generation of crack in the semiconductor element by heat stress can be prevented, because the copper tungsten plate 6 is soldered on the upper surface of the copper heat radiator 5 on which the semiconductor element 4 is mounted. The copper tungsten plate 6 is also soldered on the lower surface of the copper heat radiator 5 on which the semiconductor element 4 is not mounted. As a result, the bending of the copper heat radiator 5 in the lower surface direction also can be prevented. Therefore, the generation of any crack in the semiconductor element 4 can be avoided in the above-mentioned conventional example.

However, in the second conventional example of the semiconductor device, there is a problem in that high cost is required, because the copper tungsten plates 6 are soldered on both of the upper and lower surfaces of the copper heat radiator 5. Also, in the second conventional example, a solder material is not described clearly by which the copper tungsten plate is soldered on the copper heat radiator 5. If silver copper solder is used for the above soldering, even if any crack is not generated in the semiconductor element 4, the semiconductor element 4 receives a heat stress. As a result, the electric power decreases during operation. Specifically, there is a problem in that the lifetime of the semiconductor element 4 is only $1 \times 10^5$ hours in the actual operation state.

In the structure of the second conventional example of the semiconductor device shown in FIGS. 2A to 2C, one of causes which influences to the semiconductor element 4 is heat when the semiconductor element 4 is soldered on the copper tungsten plate 6. In order to eliminate the cause, it is necessary to suppress the temperature of heat treatment low when the semiconductor element 4 is soldered on the copper tungsten plate 6. Conventionally, no attention is paid to the soldering of the semiconductor element 4.

In order to improve the lifetime of the semiconductor element, it is necessary to relax the heat stress applied to the semiconductor element. For this purpose, the temperature of the heat treatment should be set low. However, even if the temperature of the heat treatment is set low, it is impossible to completely remove an influence of the heat treatment which is applied to the semiconductor element. Therefore, the influence of the heat treatment applied to the semiconductor element must be considered. One of the causes that crack is generated in the semiconductor element is the bending of the heat radiator during heat cycles. In order to prevent the bending of the heat radiator, a reinforcement plate should be installed in the heat radiator. A solder is used to install the reinforcement plate onto the heat radiator. Silver copper solder is generally used as the solder. However, because the melting point of the silver copper solder is high, the solder must be heated to the hot melting point.

SUMMARY OF THE INVENTION

The present invention is accomplished in the light of the above-mentioned circumstances. An object of the present invention is to provide a semiconductor device which can be manufactured with low cost.

Another object of the present invention is to provide a semiconductor device in which heat stress receiving during the manufacturing process can be relaxed.

Still another object of the present invention is to provide a semiconductor device which is soldered using solder having a low Young's modulus so that thermal tensor applied to the semiconductor device can be suppressed.

Yet still another object of the present invention is to provide a semiconductor device having a long lifetime compared to conventional semiconductor elements.

In order to achieve an aspect of the present invention, a semiconductor device includes a heat radiator having a convex portion, a reinforcement plate having a thermal conductivity and soldered on a portion of the convex portion of the heat radiator, and a semiconductor element soldered on the reinforcement plate by a solder having a melting point lower than a silver copper solder.

The reinforcement plate has approximately the same thermal expansion coefficient as the semiconductor element and is, for example, a copper tungsten plate.

The solder is a gold tin solder and the reinforcement plate is soldered on a portion of the convex portion of the heat radiator by the solder.

When the heat radiator may have a concave portion in the convex portion corresponding to the reinforcement plate, the reinforcement plate is soldered in the concave portion.

In order to achieve another aspect of the present invention, a semiconductor device includes a heat radiator having a convex portion, a reinforcement plate having a thermal conductivity and soldered on a portion of the convex portion of the heat radiator, and a semiconductor element soldered on the reinforcement plate by a solder having a Young's modulus lower than a silver copper solder.

In order to achieve still another aspect of the present invention, a semiconductor device includes a heat radiator having a convex portion, a reinforcement plate having a thermal conductivity and soldered on a portion of the convex portion of the heat radiator, and a semiconductor element soldered on the reinforcement plate by a solder having a Young's modulus lower than a silver copper solder and a melting point lower than the silver copper solder.

DESCRIPTION OF THE PREFERRED EMBODIMENT

Next, a semiconductor device of the present invention will be described below in detail with reference to the attached drawings.

Figure 1A:
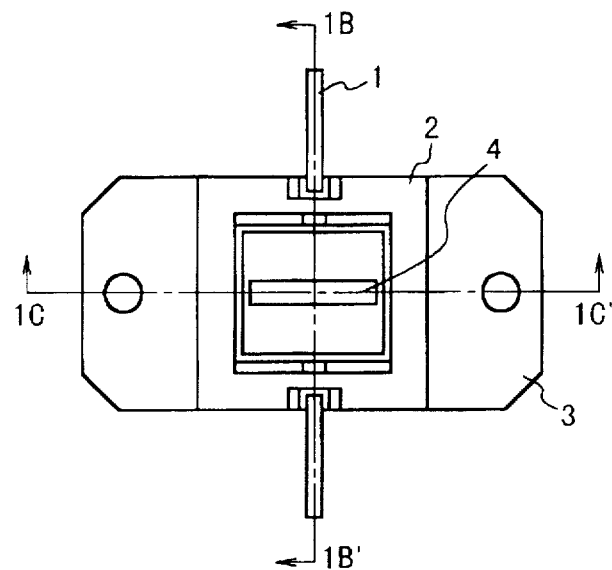
FIG. 1A is a plan view illustrating a semiconductor device with a heat radiator in the first conventional example.
Figure 1B:
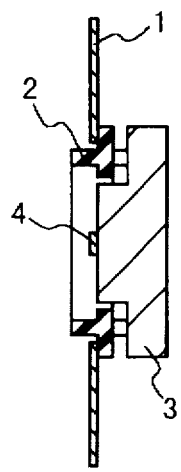
FIG. 1B is a vertical cross sectional view of the semiconductor device of the first conventional example shown in FIG. 1A when it is cut along the line 1B—1B'.
Figure 1C:
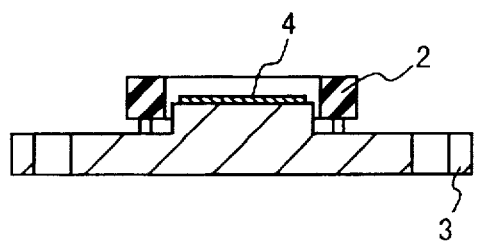
FIG. 1C is a horizontal cross sectional view of the semiconductor device of the first conventional example shown in FIG. 1A when it is cut along the line 1C—1C'.
Figure 2A:
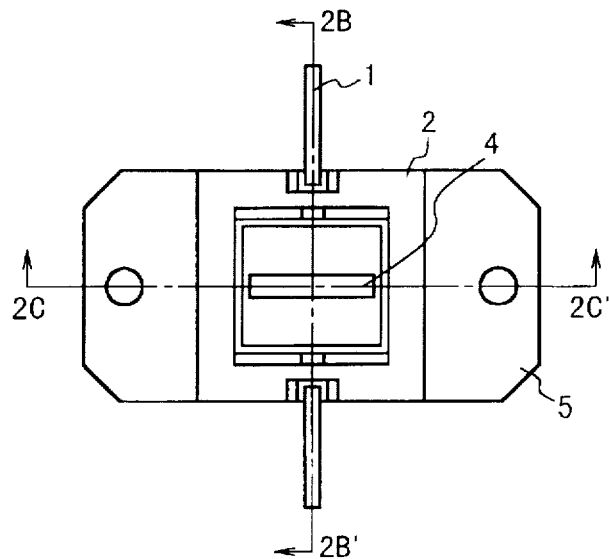
FIG. 2A is a plan view illustrating a semiconductor device with a heat radiator in the second conventional example.
Figure 2B:
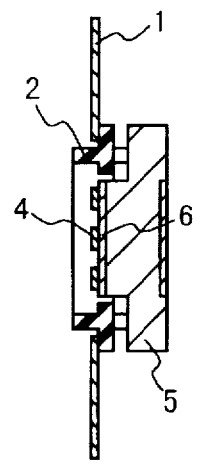
FIG. 2B is a vertical cross sectional view of the semiconductor device of the second conventional example shown in FIG. 2A when it is cut along the line 2B—2B'.
Figure 2C:
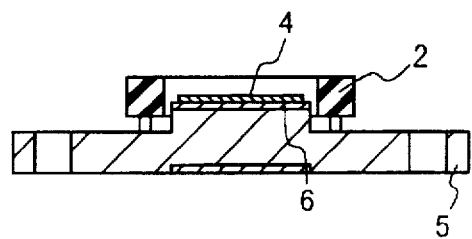
FIG. 2C is a horizontal cross sectional view of the semiconductor device of the second conventional example shown in FIG. 2A when it is cut along the line 2C—2C'.
Figure 3A:
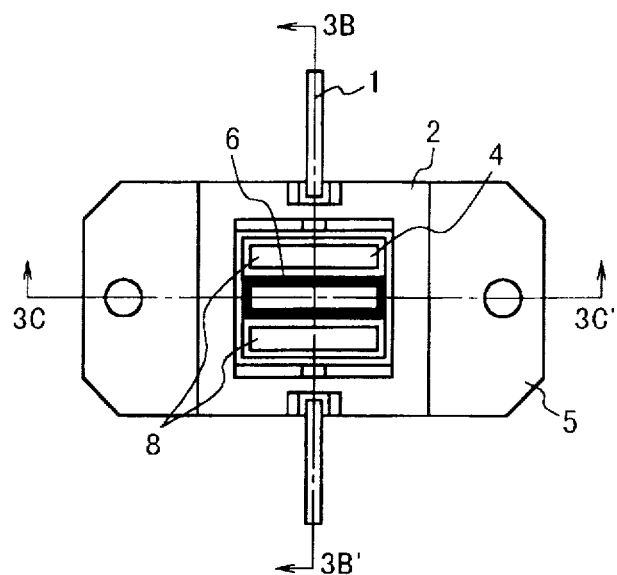
FIG. 3A is a plan view illustrating a semiconductor device with a heat radiator according to the first embodiment of the present invention.
Figure 3B:
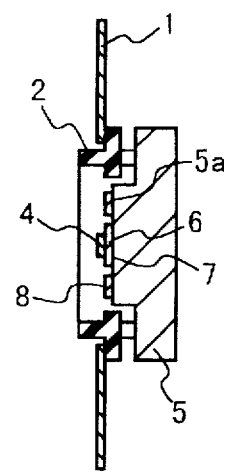
FIG. 3B is a vertical cross sectional view of the semiconductor device of the first embodiment shown in FIG. 3A when it is cut along the line 3B—3B'.
Figure 3C:
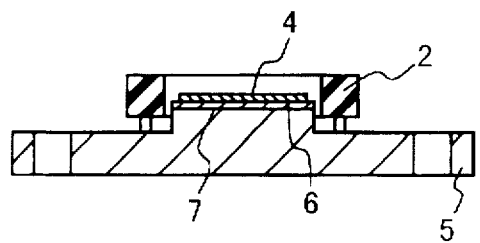
FIG. 3C is a horizontal cross sectional view of the semiconductor device of the first embodiment shown in FIG. 3A when it is cut along the line 3C—3C'.

First, the semiconductor device according to the first embodiment of the present invention will be described below. FIG. 3A is a plan view illustrating a semiconductor device with a heat radiator according to the first embodiment of the present invention, FIG. 3B is a vertical cross sectional view of the semiconductor device of the first embodiment shown in FIG. 3A when it is cut along the line 3B—3B', and FIG. 3C is a horizontal cross sectional view of the semiconductor device of the first embodiment shown in FIG. 3A when it is cut along the line 3C—3C'. Referring to FIGS. 3A to 3C, in the semiconductor device according to the first embodiment of the present invention, a heat radiator 5 has a flat convex portion. A reinforcement plate 6 is attached onto the center of the convex portion of the heat radiator 5. A semiconductor element 4 is installed onto the reinforcement plate 6. Input/output matching circuit boards 8 are installed on the portions of the convex portion on which the reinforcement plate 6 is not attached. A ceramic sealing body 2 is positioned on the peripheral recess portion of the heat radiator 5. The ceramic sealing body 2 has an opening on the center. This opening is covered by a cap in the following process. Leads 1 extend from the end portions of the ceramic sealing body 2.

The heat radiator 5 is made of metal which has a high thermal conductivity such that heat generated from the semiconductor element 4 can be effectively radiated. For instance, the heat radiator 5 is made of copper (Hereinafter, the heat radiator 5 is also referred to as a copper heat radiator 5). The reinforcement plate 6 prevents the bending of the heat radiator 5. A metal plate which has approximately the same thermal expansion coefficient as the semiconductor element 4 is used for the reinforcement plate 6. In the first embodiment, a copper tungsten plate is used as the reinforcement plate 6 (Hereinafter, the reinforcement plate 6 is also referred to a copper tungsten plate 6).

Next, a method of manufacturing the semiconductor device of the first embodiment will be described.

The copper tungsten plate 6 is soldered by gold tin solder 7 on the center of the convex portion of copper heat radiator 5. Subsequently, the input/output matching circuit boards 8 are mounted by the gold tin solder 7 on the upper and lower portions, i.e., the portions of the convex portion of copper heat radiator 5 where the copper tungsten plate 6 is not mounted.

Next, the semiconductor element 4 is soldered by the gold tin solder 7 on the copper tungsten plate 6. Subsequently, the input/output matching circuit boards 8 and the semiconductor element 4 are connected by a wire bonding method.

Next, the ceramic sealing body 2 on which the leads 1 are already installed is attached to the copper heat radiator 5. The, the input/output matching circuits 8 and the leads 1 are connected. Subsequently, the opening of the ceramic sealing body 2 is covered by a ceramic plate. In this manner, the semiconductor element 4 is sealed.

In the above first embodiment, the copper tungsten plate 6 as a reinforcement plate is soldered on an element mounting surface of the convex portion of the copper heat radiator 5 by a solder such as gold tin solder 7 having a low melting point and a low Young's modulus. The semiconductor element 4 is soldered by the gold tin solder 7 on the copper tungsten plate 6. The silver copper solder has the melting point of 780° C. The solder used in the present invention is preferable to have a melting point lower than the silver copper solder and the gold tin solder having the melting point of 280° C. is preferable.

In the case that a solder such as silver copper with a high Young's modulus is used, when the copper heat radiator 5 is stretched due to heat in some length, the solder is also stretched to a large extent. That is, the copper tungsten plate 6 soldered on the copper heat radiator 5 undergoes influence of the large stretch of the solder. The same thing can be applied to the copper tungsten plate 6 and the semiconductor element 4 soldered on the copper tungsten plate 6. Accordingly, there is increased the possibility that any crack is generated in the semiconductor element 4.

However, if the solder such as gold tin solder is used which has a Young's modulus lower than the silver copper solder having the Young's modulus of 9000 Kg/mm², even if the copper heat radiator 5 is stretched as described above, the stretch of the solder 7 is small. Therefore, the influence which the copper tungsten plate 6 and the semiconductor element 4 undergo is also small. That is, the gold tin solder functions as a buffer layer.

Next, if the solder such as the gold tin solder having a low melting point is used, the temperature when the semiconductor element 4 is soldered on the copper tungsten plate 6 may be low. That is, the semiconductor element 4 receive no heat shock or a little even if it receives. The following table 2 shows the results of the lifetime test which is performed to the conventional example which the silver copper solder having the high melting point is used and the semiconductor device of the present invention in which the gold tin solder is used, in the soldering of the copper tungsten plate 6 onto the copper heat radiator 5.

TABLE 2

|  | Copper tungsten with silver copper solder | Copper tungsten with gold tin solder |
| --- | --- | --- |
| lifetime (MTF) | $1 \times 10^5$ | $1 \times 10^6$ |

As seen from the table 2, in the semiconductor device of the present invention, the lifetime of the semiconductor element is improved by almost 1 order, compared to the semiconductor device of the conventional example. Also, even if the structure in which the copper tungsten plate 6 is soldered only on one of the surfaces of the copper heat radiator 5 is adopted, the bending quantity is very small because the low melting point solder is used. The bending quantity is the same level as the conventional example, i.e. a maximum of 60 μm.

Figure 4A:
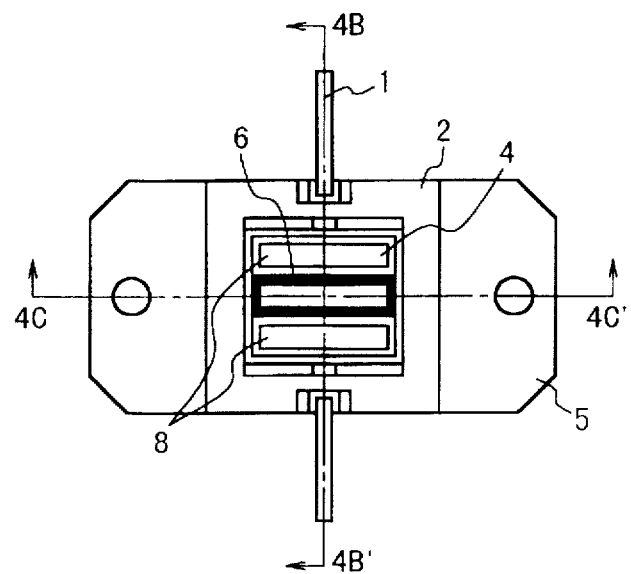
FIG. 4A is a plan view illustrating a semiconductor device with a heat radiator according to the second embodiment of the present invention.
Figure 4B:
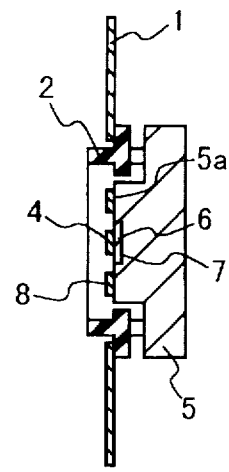
FIG. 4B is a vertical cross sectional view of the semiconductor device of the second embodiment shown in FIG. 4A when it is cut along the line 4B—4B'.
Figure 4C:
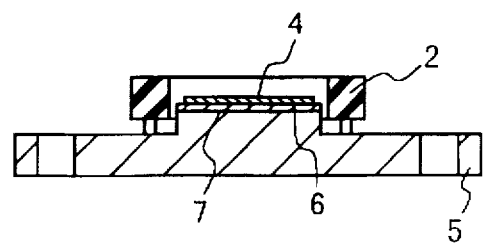
FIG. 4C is a horizontal cross sectional view of the semiconductor device of the second embodiment shown in FIG. 4A when it is cut along the line 4C—4C'.

Next, the semiconductor device according to the second embodiment of the present invention will be described. FIG. 4A is a plan view illustrating a semiconductor device with a heat radiator according to the second embodiment of the present invention. FIG. 4B is a vertical cross sectional view of the semiconductor device of the second embodiment shown in FIG. 4A when it is cut along the line 4B—4B', and FIG. 4C is a horizontal cross sectional view of the semiconductor device of the second embodiment shown in FIG. 4A when it is cut along the line 4C—4C'. The semiconductor device of the second embodiment has the structure similar to that of the semiconductor device in the first embodiment. Therefore, the difference point from the semiconductor device in the first embodiment will be described.

Referring to FIG. 4B, in the second embodiment, a concave portion 9 which corresponds to the copper tungsten plate 6 is formed in the center of the convex portion of the copper heat radiator 5. The copper tungsten plate 6 is soldered by the gold tin solder in this concave portion 9. At this time, the height of the surface of copper tungsten turn 6 becomes approximately identical to the surface of convex portion of the copper heat radiator 5. After that, the input/output matching circuit boards 8 are soldered by the gold tin solder. Also, the semiconductor element 4 is soldered by the gold tin solder 7 on the copper tungsten plate 6.

Subsequently, the input/output matching circuit boards 8 and the semiconductor element 4 are connected by the bonding wire method.

In this case, the height of semiconductor element 4 and the height of input/output matching circuit boards 8 which are arranged on the either side of the semiconductor element 4 becomes approximately identical to each other. Therefore, the wire bonding method for connecting the semiconductor element 4 and the input/output matching circuit boards 8 can be easily performed. Also, the length of wire can be freely controlled and the characteristic can be improved.

The semiconductor device in the second embodiment of the present invention can achieve the same advantages as the semiconductor device in the first embodiment.

As described above, according to the semiconductor device of the present invention, because the structure in which an auxiliary plate is soldered is used only for one of the surfaces of the heat radiator, the cost for one copper tungsten plate can be reduced, compared to the conventional example. Also, it is possible to suppress the bending quantity to the same level as the conventional example, e.g., a maximum of 60 μm, because the low melting point solder such as the gold tin solder is used, even if the structure using the copper tungsten plate on the one surface is employed. Further, because the solder having the low melting point such as the gold tin solder is used, the heat shock given to the semiconductor element is small. Furthermore, because the solder such as the gold tin solder having a low Young's modulus is used, any crack is generated during heat cycles. In this manner, by using the solder having the low melting point and the low Young's modulus for soldering the metal heat radiator and the copper tungsten plate, the heat stress to the semiconductor element becomes small to 9000 kg/nm², so that the lifetime of the semiconductor element can be improved by about one order, compared to the case where the silver copper solder having a high Young's modulus is used.

What is claimed is:

1. A semiconductor device comprising:
   a heat radiator having a convex portion;
   a reinforcement plate having a thermal conductivity and soldered on a portion of said convex portion of said heat radiator; and
   a semiconductor element soldered on said reinforcement plate by a solder having a melting point lower than a silver copper solder; wherein
   said heat radiator has a concave portion in said convex portion corresponding to said reinforcement plate, and wherein
   said reinforcement plate is soldered in said concave portion.

2. A semiconductor device according to claim 1, wherein said reinforcement plate has approximately the same thermal expansion coefficient as said semiconductor element.

3. A semiconductor device according to claim 1, wherein said reinforcement plate is a copper tungsten plate.

4. A semiconductor device according to claim 1, wherein said solder having a melting point lower than a silver copper solder is a gold tin solder.

5. A semiconductor device according to claim 1, wherein said reinforcement plate is soldered on a portion of said convex portion of said heat radiator by said solder having a melting point lower than a silver copper solder.

6. A semiconductor device comprising:
   a heat radiator having a convex portion;
   a reinforcement plate having a thermal conductivity and soldered on a portion of said convex portion of said heat radiator; and a semiconductor element soldered on said reinforcement plate by a solder having a Young's modulus lower than a silver copper solder; wherein said heat radiator has a concave portion in said convex portion corresponding to said reinforcement plate, and wherein said reinforcement plate is soldered in said concave portion.

7. A semiconductor device according to claim 6, wherein said reinforcement plate has approximately the same thermal expansion coefficient as said semiconductor element.

8. A semiconductor device according to claim 6, wherein said reinforcement plate is a copper tungsten plate.

9. A semiconductor device according to claim 6, wherein said solder having a young's modulus lower than a silver copper solder is a gold tin solder.

10. A semiconductor device according to claim 6, wherein said reinforcement plate is soldered on a portion of said convex portion of said heat radiator by said solder having a melting point lower than a silver copper solder.

11. A semiconductor device comprising:

a heat radiator having a convex portion;

a reinforcement plate having a thermal conductivity and soldered on a portion of said convex portion of said heat radiator; and a semiconductor element soldered on said reinforcement plate by a solder having a Young;s modulus lower than a silver copper solder and a melting point lower than a silver copper solder; wherein said heat radiator has a concave portion in said convex portion corresponding to said reinforcement plate, and wherein said reinforcement plate is soldered in said concave portion.

12. A semiconductor device according to claim 11, wherein said reinforcement plate has approximately the same thermal expansion coefficient as said semiconductor element.

13. A semiconductor device according to claim 11, wherein said reinforcement plate is a copper tungsten plate.

14. A semiconductor device according to claim 11, wherein said solder having a Young's modulus lower than a silver copper solder and a melting point lower than the silver copper solder is a gold tin solder.

15. A semiconductor device according to claim 11, wherein said reinforcement plate is soldered on a portion of said convex portion of said heat radiator by said solder having a melting point lower than a silver copper solder and a Young's modulus lower than the silver copper solder.

* * * * *